US011549995B2

(12) United States Patent
Tian

(10) Patent No.: US 11,549,995 B2
(45) Date of Patent: Jan. 10, 2023

(54) TEST BOARD, TEST SYSTEM AND TEST METHOD FOR CHARGING DEVICE

(71) Applicant: GUANGDONG OPPO MOBILE TELECOMMUNICATIONS CORP., LTD., Guangdong (CN)

(72) Inventor: Chen Tian, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 396 days.

(21) Appl. No.: 16/626,262

(22) PCT Filed: Sep. 30, 2018

(86) PCT No.: PCT/CN2018/109078
§ 371 (c)(1),
(2) Date: Dec. 23, 2019

(87) PCT Pub. No.: WO2020/062235
PCT Pub. Date: Apr. 2, 2020

(65) Prior Publication Data
US 2021/0333332 A1   Oct. 28, 2021

(51) Int. Cl.
*G01R 31/40* (2020.01)
*H02J 7/00* (2006.01)
*H01M 10/42* (2006.01)

(52) U.S. Cl.
CPC .......... *G01R 31/40* (2013.01); *H01M 10/425* (2013.01); *H01M 10/4285* (2013.01);
(Continued)

(58) Field of Classification Search
CPC ...... G01R 31/40; G01R 31/36; G01R 31/364; G01R 31/3644; G01R 31/382;
(Continued)

(56) References Cited

U.S. PATENT DOCUMENTS

| 11,275,395 | B2* | 3/2022 | Chamberlain .... H04W 52/0206 |
| 2013/0346025 | A1* | 12/2013 | Schulz ............ B60L 53/60 702/182 |
| 2017/0179741 | A1* | 6/2017 | Tian ............... H02J 7/00304 |

FOREIGN PATENT DOCUMENTS

| CN | 1548977 A | 11/2004 |
| CN | 101865958 A | 10/2010 |

(Continued)

OTHER PUBLICATIONS

ISR with English translation for PCT application PCT/CN2018/109078.
(Continued)

*Primary Examiner* — Nathaniel R Pelton
(74) *Attorney, Agent, or Firm* — Young Basile Hanlon & MacFarlane, P.C.

(57) ABSTRACT

Embodiments of the present disclosure provide a test system, a test method, and a test board for a charging device. The test board includes: a connecting circuit, configured to be connected to a charging device and a load module respectively, to form a test loop between the charging device and the load module through the connecting circuit; a first communication module, configured to communicate with an upper computer; a second communication module, configured to communicate with the charging device; and a control module, connected to the first communication module and the second communication module respectively, and configured to receive command information sent by the upper computer through the first communication module, and generate a test command according to the command information, to cause the test board or the charging device to execute the test command.

18 Claims, 4 Drawing Sheets direction of current

(52) U.S. Cl.
CPC ........ *H02J 7/00034* (2020.01); *H02J 7/0047* (2013.01); *H01M 2010/4278* (2013.01); *H02J 2207/30* (2020.01)

(58) Field of Classification Search
CPC .. H02J 7/00034; H02J 7/0047; H02J 2207/30; H01M 10/425; H01M 10/4285; H01M 2010/4278
USPC .......................................................... 320/137
See application file for complete search history.

(56) References Cited

FOREIGN PATENT DOCUMENTS

| | | |
|---|---|---|
| CN | 102013722 A | 4/2011 |
| CN | 103033760 A | 4/2013 |
| CN | 103257286 A | 8/2013 |
| CN | 104020422 A | 9/2014 |
| CN | 105527525 A | 4/2016 |
| CN | 205404694 U | 7/2016 |
| CN | 106030961 A | 10/2016 |
| CN | 207352137 U | 5/2018 |
| JP | 2013094048 A | 5/2013 |
| JP | 2016158364 A | 9/2016 |
| KR | 20160136283 A | 11/2016 |
| WO | 2011031801 A3 | 7/2011 |

OTHER PUBLICATIONS

Korean Notice of Allowance with English Translation for KR Application 1020207002651 dated Nov. 30, 2021. (5 pages).
Chinese Office Action with English Translation for CN Application 201880023338.5 dated Jan. 7, 2022. (28 pages).
Construction Lifting Signal Division, Basic Concept of Circuit, 6 pages.
Korean Office Action with English Translation for KR Application 10-2020-7002651 dated May 21, 2021. (13 pages).
OA with English translation for JP application 2020-504332 dated Feb. 5, 2021.
Extended European Search Report for EP application 18934820.4 dated Dec. 4, 2021.
China First Office Action with English Translation for CN Application 201880023338.5 dated Mar. 1, 2021. (15 pages).
India Examination Report for IN Application 202017001716 dated Feb. 25, 2021. (5 pages).
Chinese Second Office Action with English Translation for CN Application 201880023338.5 dated Aug. 25, 2021. (25 pages).
Japanese Office Action with English Translation for JP Application 2020-504332 dated Oct. 12, 2021. (6 pages).
Communication pursuant to Article 94(3) EPC for EP Application 18934 820.4 dated Sep. 8, 2021. (7 pages).
Chinese Third Office Action with English Translation for CN Application 201880023338.5 dated Apr. 22, 2022. (24 pages).
Communication pursuant to Article 94(3) EPC for EP Application 18934820.4 dated Feb. 24, 2022. (7 pages).
Communication pursuant to Article 94(3) EPC for EP Application 18934820.4 dated Aug. 26, 2022. (5 pages).

\* cited by examiner

TEST BOARD, TEST SYSTEM AND TEST METHOD FOR CHARGING DEVICE

CROSS-REFERENCE TO RELATED APPLICATION(S)

This application is a 371 application of International Application No. PCT/CN2018/109078, filed on Sep. 30, 2018, the entire disclosure of which is hereby incorporated by reference.

TECHNICAL FIELD

The present disclosure relates to a field of charging technologies, and more particularly, to a test board, a test system and a test method for a charging device.

BACKGROUND

In the related art, a charging device such as an adapter is usually tested by manually creating an abnormality and determining an abnormal state by people. However, the problem in the related art is that manual testing is required, which is cumbersome, time-consuming and laborious, and it takes a long time to complete a full set of tests.

SUMMARY

In a first aspect, embodiments of the present disclosure provide a test board for a charging device. The test board includes: a connecting circuit, configured to be connected to a charging device and a load module respectively, to form a test loop between the charging device and the load module through the connecting circuit; a first communication module, configured to communicate with an upper computer; a second communication module, configured to communicate with the charging device; and a control module, connected to the first communication module and the second communication module respectively, and configured to receive command information sent by the upper computer through the first communication module, and generate a test command according to the command information, to cause the test board or the charging device to execute the test command.

In a second aspect, embodiments of the present disclosure provide a test system. The test system includes: a load module; a test board according to embodiments of the first aspect; a charging device, configured to form a test loop with the load module through the test board, and communicate with the test board; and an upper computer, configured to communicate with the test board.

In a third aspect, embodiments of the present disclosure provide a test method for a charging device. The method includes: forming a test loop between the charging device and a load module through a test board; receiving by the test board, command information sent by an upper computer; generating by the test board, a test command according to the command information; and executing the test command by the charging device or the test board.

Additional aspects and advantages of the present disclosure will be given in the following description, some of which will become apparent from the following description or be learned from practices of the present disclosure.

BRIEF DESCRIPTION OF DRAWINGS

The foregoing and/or additional aspects and advantages of the present disclosure become obvious and easily understood in descriptions of embodiments with reference to the following accompanying drawings.

DETAILED DESCRIPTION

Embodiments of the present disclosure will be described below in detail, examples of which are illustrated in accompanying drawings. Throughout the drawings, the same or similar reference signs refer to the same or similar elements or elements that have the same or similar functions. The embodiments described below with reference to the accompanying drawings are merely illustrative and intends to illustrate and explain the present disclosure, and should not be construed as a limit to the present disclosure.

A test board, a test system and a test method for a charging device according to embodiments of the present disclosure are described below with reference to the accompanying drawings. The test board, the test system and the test method for a charging device are applicable for testing the charging device.

In embodiments of the present disclosure, the charging device may be applied to charge an electronic device. The electronic device may refer to a terminal, which may include, but is not limited to, a smart phone, a computer, a Personal Digital Assistant (PDA), a wearable device, a Bluetooth headset, a gaming device, and a camera device. The charging device may be a device having a function of charging the terminal, such as an adapter, a portable power supply (a power bank), or a car charger. Taking the adapter as an example, the charging device may be a VOOC adapter, and a charging circuit of the VOOC adapter may be directly connected to a battery of the electronic device through a charging interface.

It can be understood that in order to ensure the safety and reliability of the charging device, the charging device is usually provided with a safety protection mechanism for protecting against abnormalities, such as, overvoltage, overcurrent and over temperature, abnormal path impedance, and abnormality in switch tube. Therefore, during the actual use, the charging device enters a protection state once abnormalities in the charging device are detected.

For this, with the test system for the charging device according to the embodiments of the present disclosure, the test board simulates the state of the electronic device, communicates with the charging device in real time, deliberately creates an abnormality, and monitors the state of the charging device in real time, and determines whether the charging device enters the corresponding protection state once the abnormality is detected, thereby testing the efficiency of respective protection functions.

The test board for the charging device according to the embodiments of the present disclosure is described in detail below with reference to FIGS. 1-4.

Figure 1:
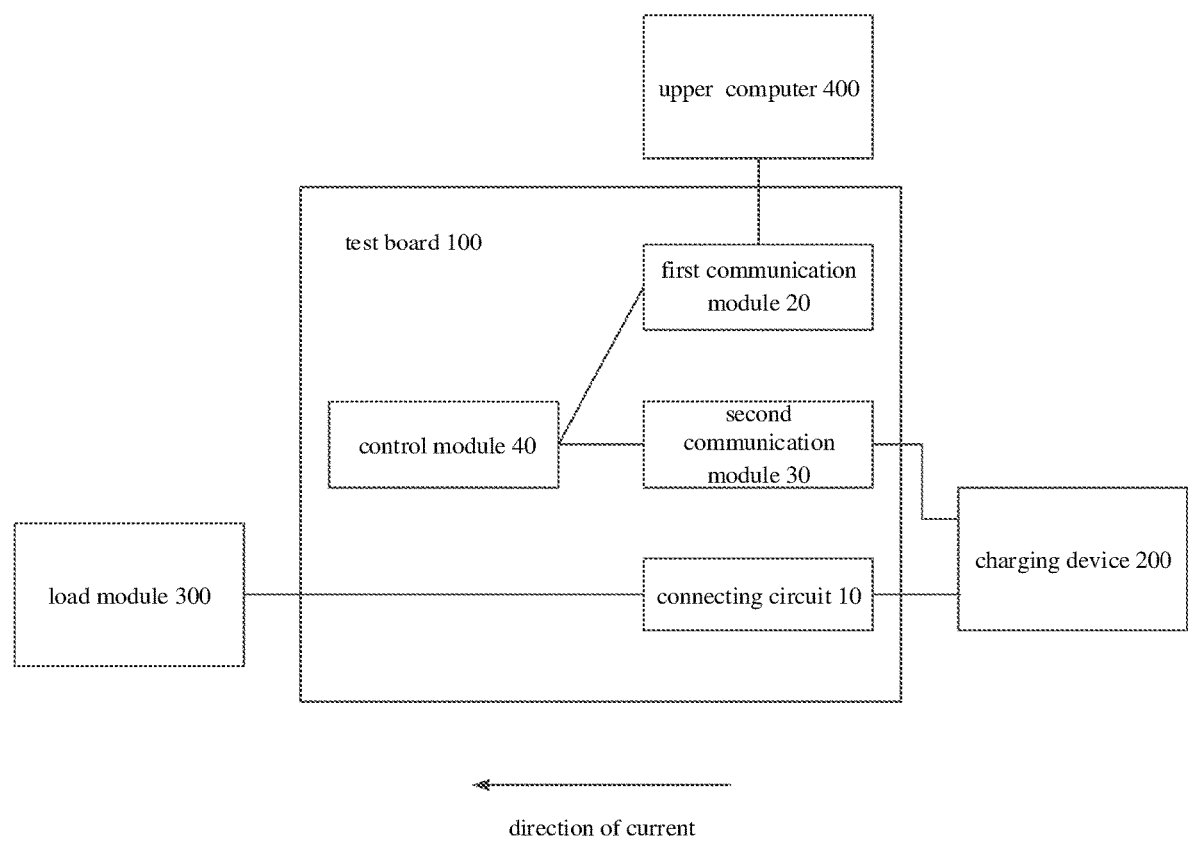
FIG. 1 is a block diagram of a test board for a charging device according to embodiments of the present disclosure.

As illustrated in FIG. 1, a test board 100 for a charging device according to the embodiments of the present disclosure includes: a connecting circuit 10, a first communication module 20, a second communication module 30, and a control module 40.

The connecting circuit 10 is configured to be connected to a charging device 200 and a load module 300 respectively, to form a test loop between the charging device 200 and the load module 300 through the connecting circuit 10. In other words, the current output from the charging device 200 flows to the load module 300 via the connecting circuit 10 of the test board 100, and the direction of current is indicated by the direction of the arrow in FIG. 1.

The first communication module 20 is configured to communicate with an upper computer 400. The second communication module 30 is configured to communicate with the charging device 200. The control module 40 is connected to the first communication module 20 and the second communication module 30 respectively. In other words, the control module 40 may receive information sent by the upper computer 400 and send the information to the upper computer 400 through the first communication module 20. Similarly, the control module 40 may receive information sent by the charging device 200 and send the information to the charging device 200 through the second communication module 30.

It should be noted that the load module 300 may be a battery-free load, and the test board 100 cooperates with the load module 300 to simulate the state of the electronic device. For example, the test board 100 simulates the state of the battery during fast charging of the electronic device. The state of the battery includes the current of the battery, the voltage of the battery, and the like. Then, the test board 100 reports the simulated battery state to the charging device 30, and the charging device 30 may simulate the charging process according to the battery state reported by the test board 20.

In the process of test, the control module 40 may receive the command information sent by the upper computer 400 through the first communication module 20, and generate a corresponding test command according to the command information, so that the test board 100 or the charging device 200 may execute the test command.

As an example, the upper computer 400 may send the command information indicating the type of the present test to the test board 100. For example, the types of the present test may include an over voltage test, an over temperature test, a path impedance test, or the like. The control module 40 may receive the command information sent by the upper computer 400 through the first communication module 20, and determine the type of the present test according to the command information, and generate a corresponding test command according to the type of the present test. Then, the execution body of the generated test command is determined. For example, when the execution body of the test command is the charging device 200, the control module 40 may send the test command to the charging device 200 through the second communication module 30, and the charging device 200 executes the test command, such that the charging device implements the test of a corresponding type. For another example, when the execution body of the test command is the test board 100, the control module 40 may directly execute the test command, so that the charging device can realize the test of a corresponding type.

Therefore, an automatic test can be realized, which is easy to operate, labor-saving and time-saving, and the duration of completing a full set of tests is shortened.

It could be understood that when a plurality of tests are required on the charging device 200, the upper computer 400 may sequentially send a plurality of command information in a set test timing sequence, and each time the test board 100 receives the command information, a corresponding test command is generated according to the received command information, for performing test according to the test command. Moreover, after the present test is completed, the upper computer 400 may transmit the next command information automatically or according to a command input by the user. As a result, a full set of tests can be automatically implemented, which is easy to operate, labor-saving and time-saving, and the duration of completing the full set of tests is shortened.

In some embodiments of the present disclosure, after the test command is executed by the test board 100 or the charging device 200, the control module 40 is further configured to acquire state information of the charging device 200, and determine a test result of the test command according to the state information of the charging device 200, and send the test result to the upper computer 400.

In some embodiments of the present disclosure, after the test command is executed by the test board 100 or the charging device 200, the control module 40 is configured to acquire state information of the charging device 200, and send the state information of the charging device 200 to the upper computer 400, so that the upper computer 400 determines a test result according to the state information of the charging device 200.

As an example, the state information of the charging device 200 may include running state information such as a protection state, and output status information such as an output voltage, and an output current.

In detail, when the test command is executed by the test board 100, the control module 40 simulates an abnormal state indicated by the test command, and collects running state information of the charging device 200, in which the running state information is configured to indicate whether the charging device 40 enters a protection state.

It could be understood that the upper computer 400 may send command information to the test board 100, and the command information may indicate the test type. After receiving the command information through the second communication module 30, the control module 40 of the test board 100 may generate the test command according to the received command information, and then the control module 40 may execute the test command and simulate the abnormal state indicated by the test command. Since the charging device 200 forms a test loop with the load module 300 through the connecting circuit 10, the charging device 200 may detect the abnormal state and enter the protection state when the protection function of the abnormal state is normal.

Next, the test board 100 receives the running state information of the charging device 200 through the second communication module 30, that is, receives the information indicating whether the charging device 200 enters the protection state. The test board 100 may determine whether the charging device 200 enters the protection state according to the running state information, or may send the running status information to the upper computer 400 to cause the upper computer 400 to determine whether the charging device 200 enters the protection state. If the charging device enters the protection state, it is confirmed that the charging device has the abnormality protection function or the abnormality protection function is effective. If the charging device does not enter the protection state, it is confirmed that the charging device does not have the abnormality protection function or the abnormal protection function is invalid.

As an example, taking the protection function test of the path impedance from the charging device 200 to the load module 300 as an example, when a test on the path impedance protection function is implemented, the control module 40 may simulate an abnormal state of the path impedance according to the test command, that is, the control module 40 may transmit a test battery voltage VBAT to the charging device 200, and the charging device 200 may receive the test battery voltage VBAT reported by the test board 100, and calculate the path impedance from the charging device 200 to the load module 300 according to the test battery voltage VBAT, and control the running state of the charging device 200, which includes but not limited to normal running state, and protection state, according to the path impedance from the charging device 200 to the load module 300. In other words, when the path impedance is greater than a preset impedance, the charging device 200 enters the protection state, and when the path impedance is greater than or equal to the preset impedance, the charging device 200 is in the normal running state.

At this time, the test board 100 acquires the running state of the charging device 200 through the second communication module 30, and determines whether the charging device 200 enters the protection state by itself according to the running state information or transmits the running state information to the upper computer 400 to cause the upper computer 400 to determine whether the charging device 200 enters the protection state. If the charging device enters the protection state, the test board 100 or the upper computer 400 confirms that the charging device has the path impedance protection function or the path impedance protection function is effective. If the charging device does not enter the protection state, the test board 100 or the upper computer 400 confirms that the charging device does not has the path impedance protection function or a path impedance protection function.

It should be noted that the charging device 200 may calculate the path impedance from the charging device 200 to the load module 300 according to the charging voltage of the charging device 200, the test battery voltage VBAT reported by the test board 100, and the charging current of the charging device 200. In other words, the charging device 200 may calculate the path impedance from the charging device 200 to the load module 300 according to the following formula.

$$R = (VBUS - VBAT)/I$$

Where R is the path impedance from the charging device 200 to the load module 300, VBUS is the charging voltage of the charging device 200, VBAT is the test battery voltage reported by the test board 100, and I is the charging current of the charging device 200.

Moreover, the control module 40 may sample the voltage on the test board and calculate the test battery voltage VBAT according to the voltage on the test board V-ADC, a simulated impedance increment $\Delta R$, and the charging current I of the charging device 200. The simulated impedance increment $\Delta R$ is greater than or equal to the preset impedance. In other words, the control module 40 may calculate the test battery voltage according to the following formula.

$$VBAT = V\text{-}ADC - \Delta R * I$$

Where VBAT is the test battery voltage, V-ADC is the voltage on the test board 100, $\Delta R$ is the simulated impedance increment, and I is the charging current of the charging device 200.

In detail, when the test command is executed by the charging device 200, the control module 40 transmits the test command to the charging device 200 through the second communication module 30, and collects output state information of the charging device 200, in which the output state information is configured to indicate the output state of the charging device 200 when running according to the test command.

It can be understood that the upper computer 400 may send the command information to the test board 100, and the command information may indicate the test type. After receiving the command information through the second communication module 30, the control module 40 of the test board 100 may generate the test command according to the received command information. Then, the control module 40 may send the test command to the charging device 200 through the second communication module 30, and the charging device 200 may execute the test command to enter a certain test state.

Next, the test board 100 may receive the output state information of the charging device 200 through the second communication module 30, such as the output voltage and the output current of the charging device 200. The test board 100 may voluntarily determine whether the output state information of the charging device 200 satisfies the test requirement according to the output state information, or may send the output state information to the upper computer 400 to cause the upper computer 400 to determine whether the output state information of the charging device 200 satisfies the test requirement.

As an example, taking a power consumption test as an example, when the power consumption test is executed, the control module 40 may send a test command to the charging device 200, the charging device 200 may enter a certain test scenario according to the test command, and the test board 100 may acquire the output state of the charging device 200 through the second communication module 30, such as voltage, and current. The test board 100 may voluntarily determine whether the charging device 200 satisfies requirements in the power consumption test according to the output state information, or may send the output state information to the upper computer 400 to cause the upper computer 400 to determine whether the requirements in the power consumption test is met.

The specific structure of the test board 200 is described below.

Figure 2:
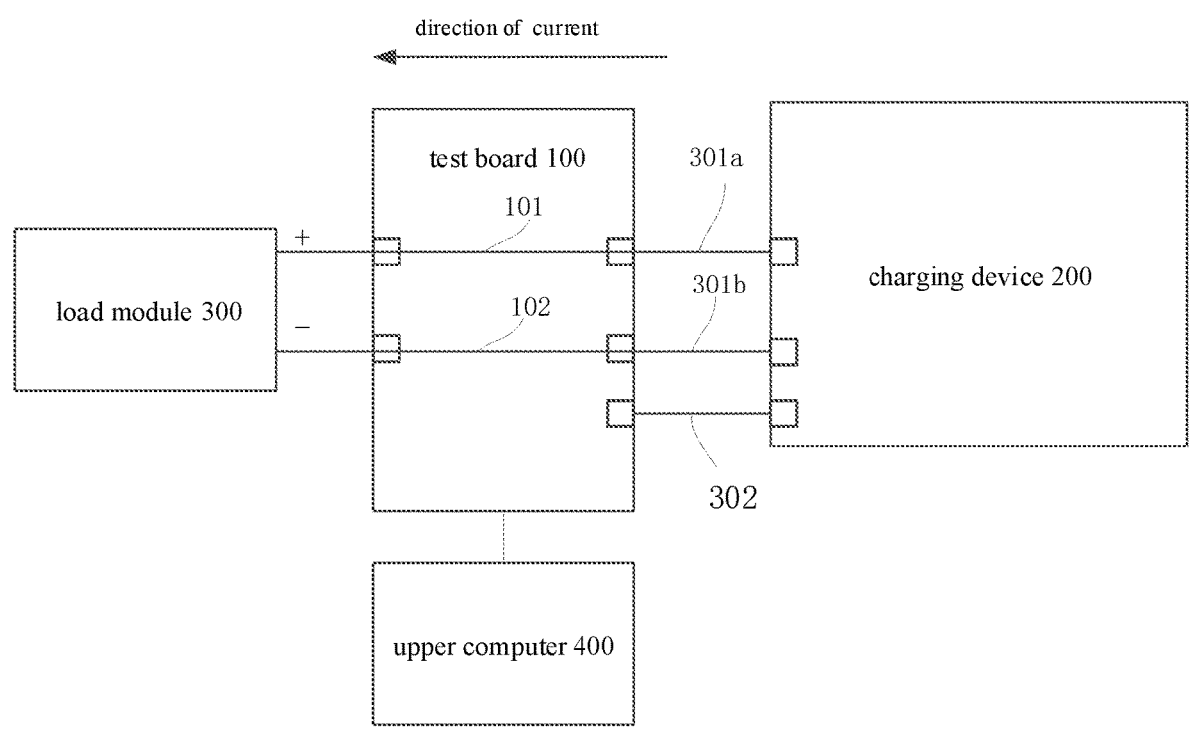
FIG. 2 is a block diagram of a test board for a charging device according to an embodiment of the present disclosure.
Figure 3:
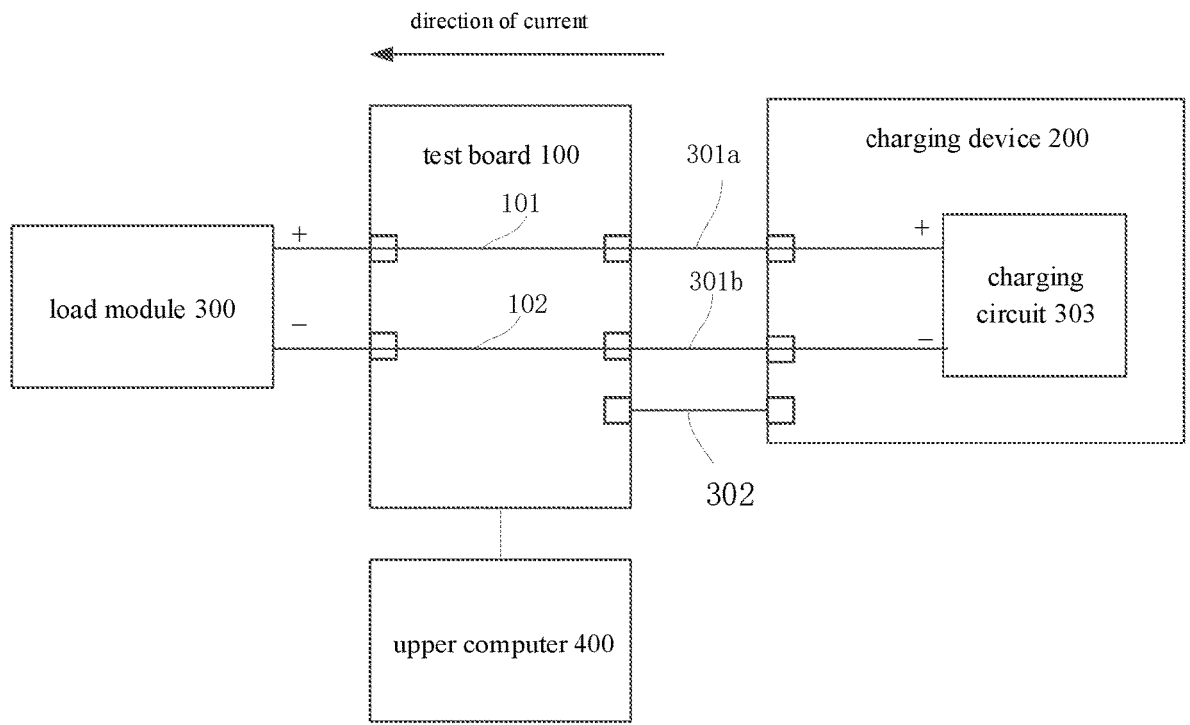
FIG. 3 is a block diagram of a test board for a charging device according to another embodiment of the present disclosure.
Figure 4:
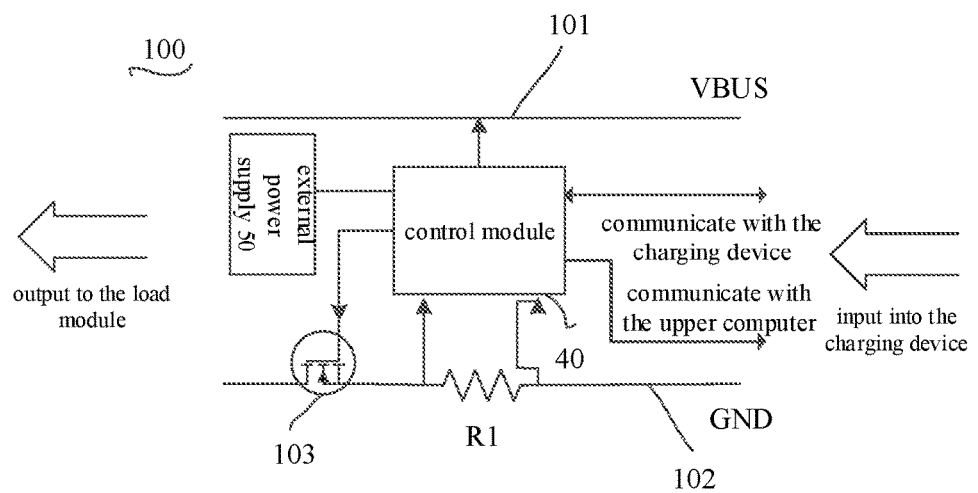
FIG. 4 is a block diagram of a test board for a charging device according to yet another embodiment of the present disclosure.

As illustrated in FIGS. 2-4, the connecting circuit 10 may include a first power line 101 and a second power line 102.

Moreover, the charging device 200 may have power supply lines, and the charging device 200 may output electric energy to the outside through the power supply lines, for example, to charge a battery of an electronic device, or to transmit electric energy to the load module 300. In detail, the power supply lines of the charging device 200 may include a positive power supply line 301a and a negative power supply line 301b. A first end of the first power line 101 is connected to a positive electrode of the load module 300, and a second end of the first power line 101 is connected to the positive power supply line 301a of the charging device 200. Moreover, a first end of the second power line 102 is connected to the negative electrode of the load module 300, and a second end of the second power line 102 is connected to the negative power supply line 301b of the charging device 200.

The positive power supply line 301a may also be connected to the positive output end + of a charging circuit 303 of the charging device 200, and the negative power supply line 301b may also be connected to the negative output end − of the charging circuit 303 of the charging device 200.

It can be understood that the current flows out from the positive output end+ of the charging circuit 303 of the charging device 200, flows into the positive electrode of the load module 300 through the positive power supply line 301a and the first power line 101 in turn, and then flows out from the negative electrode of the load module 300, and finally flows back to the negative output end—of the charging circuit 303 of the charging device 200 through the second power line 102 and the negative power supply line 301b in turn.

As an example, when the charging device 200 is connected to an electronic device, the positive power supply line 301a and the negative power supply line 301b may be respectively connected to a cathode and an anode of the battery, for charging the battery of the electronic device.

As illustrated in FIG. 4, the connecting circuit 10 further includes a switch tube 103 connected to the first power line 101 or the second power line 102. The control module 40 is connected to a control electrode of the switch tube 103, and the control module is configured to control the test loop between the charging device 200 and the load module 300 to turn on or off by controlling the switch tube 103 to be turned on or off.

It can be understood that when the switch tube 103 is turned on, the test loop between the charging device 200 and the load module 300 is turned on, and the charging device 200 outputs electric energy to the load module 300. When the switch tube 103 is turned off, the test loop between the charging device 200 and the load module 300 is broken, and the charging device 200 stops outputting electric energy to the load module 300.

The control module 40 is connected to the control electrode of the switch tube 103. When the charging device 200 is tested, the switch tube 103 may be turned on under the control of the control module 40. The switch tube 40 may be a MOS transistor or a triode. The control module 40 may be a Micro-Controller Unit (MCU).

In detail, taking the MOS transistor as an example, if the MOS transistor is placed on the first power line 101, a drain of the MOS transistor may be disposed close to the charging device 200, and a source of the MOS transistor may be disposed away from the charging device 200.

As illustrated in FIG. 4, the connecting circuit 40 may further include a sampling resistor R1. The sampling resistor R1 is connected in series on the first power line 101 or the second power line 102. Both ends of the sampling resistor R1 are connected to the control module 40. In other words, the control module 40 may sample the current on the first power line 101 or the second power line 102 through the sampling resistor R1, and the control module 40 may use the current as the current of the test loop, and control the charging device 200 according to the current, or control the switch tube 103 when the current is greater than a preset current, thereby realizing overcurrent protection.

In some embodiments of the present disclosure, the load module 300 may be an electronic load or a programmable power supply. The electronic load may be in a constant current mode or a constant voltage mode. The programmable power supply may provide power to the outside as a load.

In detail, when the load module 300 is an electronic load, the control module 40 may be connected to an external power supply 50 to cause the external power supply 50 to provide power to the control module 40. When the load module 300 is a programmable power supply, the programmable power supply also provides power to the control module 40.

In other words, the power supply of the test board 100 may be external or may adopt the programmable power supply as the load module 300, thereby preventing the control module 40 from power down after the power supply output is turned off when the charging device 200 enters the protection state.

In an embodiment of the present disclosure, as illustrated in FIG. 4, the second communication module 30 may communicate with the charging device 200 through a first communication line 105. The first communication line 105, the first power line 101, and the second power line 102 may be disposed in the same cable. The cable may be a USB cable or a Type-c cable, thereby facilitating the connection between the charging device and the test board.

In an embodiment of the present disclosure, as illustrated in FIG. 4, the first communication module 20 may communicate with the upper computer 400 through a communication cable. The communication cable may be a serial communication cable. In other words, serial communication is available between the upper computer 400 and the test board 100.

In conclusion, with the test board of the charging device proposed by embodiments of the present disclosure, a test loop is formed between the charging device and the load module through the connecting circuit, the control module communicates with the upper computer through the first communication module, and communicates with the charging device through the second communication module, and the control module receives the command information sent by the upper computer through the first communication module, and generates a corresponding test command according to the command information, to cause the test board or the charging device to execute the test command. Thereby, an automatic test can be realized, which is easy to operate, labor-saving and time-saving, and the duration of completing a full set of tests is shortened.

Based on the above embodiments, the present disclosure further provides a test system.

Figure 5:
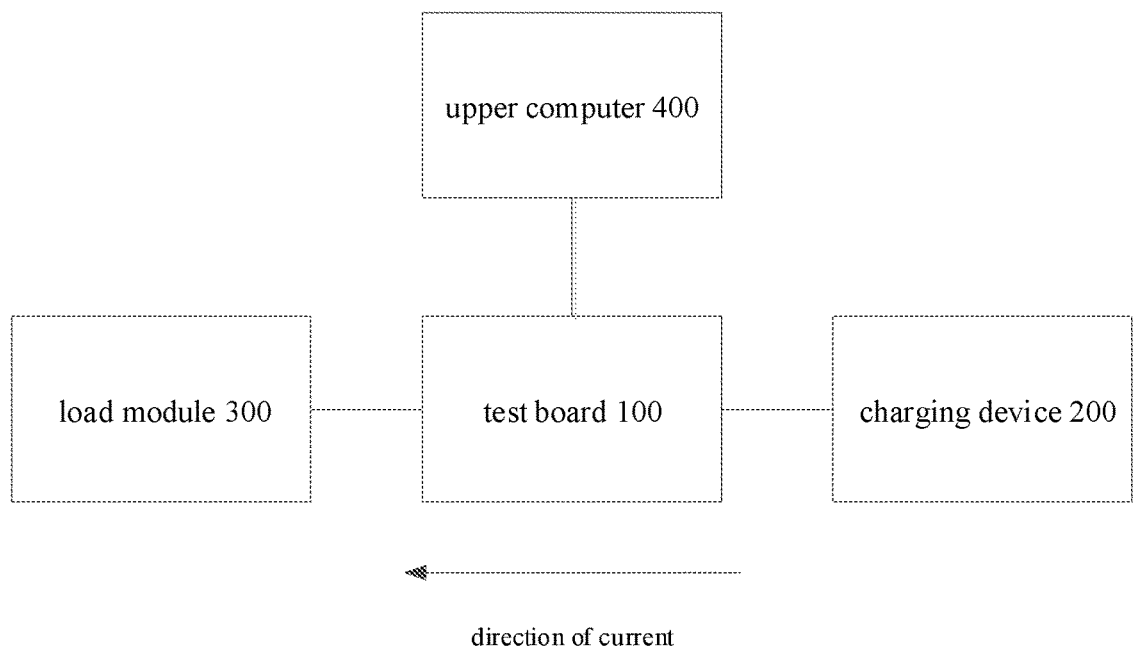
FIG. 5 is a block diagram of a test system for a charging device according to embodiments of the present disclosure.

FIG. 5 is a block diagram of a test system according to embodiments of the present disclosure. As illustrated in FIG. 5, the test system includes the load module 300, the test board 100 in foregoing embodiments, the charging device 200, and the upper computer 400.

The charging device 200 forms a test loop with the load module 300 through the test board 100. The charging device 200 also communicates with the test board 100, and the upper computer 400 communicates with the test board 100.

With the test system for the charging device provided by embodiments of the present disclosure, the automatic test can be realized, which is easy to operate, labor-saving and time-saving, and the duration of completing a full set of tests is shortened.

Corresponding to the test board for the charging device in the foregoing embodiments, the present disclosure also provides a test method for a charging device.

Figure 6:
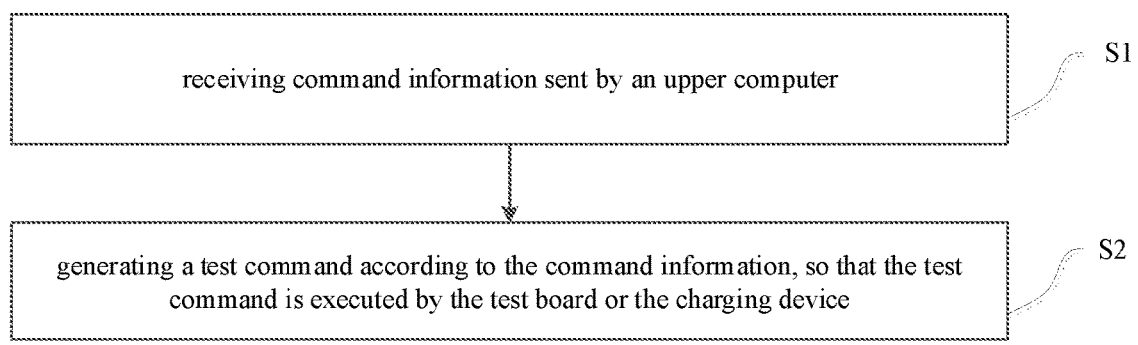
FIG. 6 is a flow chart of a test method for a charging device according to embodiments of the present disclosure.

FIG. 6 is a flow chart of a test method for a charging device according to embodiments of the present disclosure.

The method is applicable to the test board, in which a charging device forms a test loop with a load module through the test board, the test board communicates with an upper computer through the first communication module, and communicates with the charging device through the second communication module. As illustrated in FIG. 6, the method includes the following acts.

At block S1, command information sent by the upper computer is received.

At block S2, a test command is generated according to the command information, so that the test command is executed by the test board or the charging device.

In some embodiments of the present disclosure, after the test command is executed by the test board or the charging device, state information of the charging device is acquired, a test result of the test command is determined according to the state information of the charging device, and the test result is sent to the upper computer.

In some embodiments of the present disclosure, after the test command is executed by the test board or the charging device, state information of the charging device is acquired, and the state information of the charging device is sent to the upper computer, so that the upper computer determines a test result of the test command according to the state information of the charging device.

In some embodiments of the present disclosure, when the test command is executed by the test board, an abnormal state indicated by the test command is simulated, and running state information of the charging device is collected, in which the running state information is configured to indicate whether the charging device enters a protection state.

In some embodiments of the present disclosure, when the test command is executed by the charging device, the test command is sent to the charging device, and output state information of the charging device is collected, in which the output state information is configured to indicate the output state of the charging device when running according to the test command.

It should be noted that the foregoing explanation of the embodiments of the test board for the charging device is also applicable to the test method for the charging device in the embodiment, and details are not elaborated herein again.

In conclusion, with the test method for a charging device according to embodiments of the present disclosure, a test loop is formed between the charging device and the load module through the connecting circuit, the test board communicates with the upper computer and the charging device, and the test board receives the command information sent by the upper computer and generates a corresponding test command according to the command information, to cause the test board or the charging device to execute the test command. Thereby, the automatic test can be realized, which is easy to operate, labor-saving and time-saving, and the duration of completing a full set of tests is shortened.

Those skilled in the art will appreciate that the elements and algorithm steps of the various examples described in combination with the embodiments disclosed herein can be implemented in electronic hardware or a combination of computer software and electronic hardware. Whether these functions are executed by hardware or software depends on the specific application and design constraints of the solution. A person skilled in the art can use different methods to implement the described functions for each particular application, but such implementation should not be considered to be beyond the scope of the present application.

A person skilled in the art can clearly understand that for the convenience and brevity of the description, the specific working process of the system, the device and the unit described above can refer to the corresponding process in the foregoing method embodiment, and details are not described herein again.

In several embodiments provided by the present disclosure, it should be understood that, the system, devices and method disclosed in several embodiments provided by the present disclosure can be realized in any other manner. For example, the device embodiments described above can be merely examples, for example, the units are just divided according to logic functions. In practical implementation, the units can be divided in other manners, for example, multiple units or components can be combined or integrated into another system, or some features can be omitted or not executed. In addition, the mutual coupling or direct coupling or communication connection described or discussed can be via some interfaces, and indirect coupling or communication connection between devices or units may be electrical, mechanical or of other forms.

The units illustrated as separate components can be or not be separated physically, and components described as units can be or not be physical units, i.e., can be located at one place, or can be distributed onto multiple network units. It is possible to select some or all of the units according to actual needs, for realizing the objective of embodiments of the present disclosure In addition, respective functional units in respective embodiments of the present disclosure can be integrated into one processing unit, or can be present as separate physical entities. It is also possible that two or more than two units are integrated into one unit.

If the functions are realized in form of functional software units and are sold or used as separate products, they can be stored in a computer readable storage medium. Based on this understanding, the parts of the technical solutions or the essential parts of the technical solutions (i.e. the parts making a contribution to the related art) can be embodied in form of software product, which is stored in a storage medium, and includes several instructions used for causing a computer device (for example, a personal computer, a server or a network device) to execute all or part of steps in the methods described in respective embodiments of the present disclosure. The above storage medium may be any medium capable of storing program codes, including a USB flash disk, a mobile hard disk, a Read-Only Memory (ROM), a Random Access Memory (RAM), a disc, or a light disk.

The foregoing is only a specific implementation of the present disclosure, but the scope of protection of the present disclosure is not limited thereto, and any person skilled in the art can easily think of changes or substitutions within the technical scope disclosed in the present disclosure, which are covered by the scope of protection of this disclosure. Therefore, the scope of protection of the present disclosure should be determined by the scope of the claims.

What is claimed is:

1. A test board for a charging device, comprising:
   a connecting circuit, configured to be connected to a charging device and a load module respectively to form a test loop between the charging device and the load module through the connecting circuit;
   a first communication module, configured to communicate with an upper computer;
   a second communication module, configured to communicate with the charging device; and a control module, connected to the first communication module and the second communication module respectively, and configured to receive command information sent by the upper computer through the first communication module, and generate a test command according to the command information, to cause the test board or the charging device to execute the test command;

wherein when the test command is executed by the control module, the control module is configured to simulate an abnormal state indicated by the test command, and collect running state information of the charging device, wherein, the running state information is configured to indicate whether the charging device enters a protection state; the abnormal state is configured to cause the charging device enters the protection state when the charging device detects the abnormal state and has a normal protection state corresponding to the abnormal state.

2. The test board according to claim 1, wherein after the test command is executed by the test board or the charging device, the control module is further configured to acquire state information of the charging device, determine a test result of the test command according to the state information of the charging device, and send the test result to the upper computer.

3. The test board according to claim 1, wherein after the test command is executed by the test board or the charging device, the control module is further configured to acquire state information of the charging device, and send the state information of the charging device to the upper computer, to enable the upper computer to determine a test result of the test command according to the state information of the charging device.

4. The test board according to claim 1, wherein when the test command is executed by the charging device, the control module is configured to send the test command to the charging device through the second communication module, and collect output state information of the charging device, wherein the output state information is configured to indicate an output state of the charging device when running according to the test command.

5. The test board according to claim 1, wherein the connecting circuit comprises a first power line and a second power line,
a first end of the first power line is connected to a positive electrode of the load module, and a second end of the first power line is connected to a positive power supply line of the charging device; and
a first end of the second power line is connected to a negative electrode of the load module, and a second end of the second power line is connected to a negative power supply line of the charging device.

6. The test board according to claim 5, wherein the connecting circuit further comprises a switch tube connected to the first power line or the second power line, a control electrode of the switch tube is connected to the control module, and the control module is configured to control the test loop between the charging device and the load module to turn on or off by controlling the switch tube to be turned on or off.

7. The test board according to claim 5, wherein the connecting circuit further comprises a sampling resistor connected in series on the first power line or the second power line, and both ends of the sampling resistor are connected to the control module.

8. The test board according to claim 1, wherein the load module comprises an electronic load, and the control module is configured to be connected to an external power supply to cause the external power supply to provide power to the control module.

9. The test board according to claim 1, wherein the load module is a programmable power supply, the programmable power supply is configured to provide power supply to the control module.

10. The test board according to claim 5, wherein the second communication module is configured to communicate with the charging device through a first communication line, and the first communication line, the first power line, and the second power line are disposed in a same cable.

11. A test system, comprising:
a load module;
a test board;
a charging device, configured to form a test loop with the load module through the test board, and communicate with the test board; and
an upper computer, configured to communicate with the test board,
wherein the test board is configured to receive command information from the upper computer, and to generate a test command according to the command information, to cause the charging device or the test board to execute the test command;
wherein executing the test command by the test board comprises:
executing by the test board, an abnormal state indicated by the test command, the abnormal state is configured to cause the charging device enters the protection state when the charging device detects the abnormal state and has a normal protection state corresponding to the abnormal state; and
collecting by the test board, running state information of the charging device, wherein the running state information is configured to indicate whether the charging device enters a protection state.

12. A test method for a charging device, comprising:
forming a test loop between the charging device and a load through a test board;
receiving by the test board, command information sent by an upper computer;
generating by the test board, a test command according to the command information; and
executing the test command by the charging device or the test board;
wherein executing the test command by the test board comprises:
executing by the test board, an abnormal state indicated by the test command, the abnormal state is configured to cause the charging device enters the protection state when the charging device detects the abnormal state and has a normal protection state corresponding to the abnormal state; and
collecting by the test board, running state information of the charging device, wherein the running state information is configured to indicate whether the charging device enters a protection state.

13. The test method according to claim 12, after executing the test command by the test board or the charging device, further comprising:
acquiring by the test board, state information of the charging device;
determining by the test board, a test result of the test command according to the state information of the charging device; and sending by the test board, the test result to the upper computer.

14. The test method according to claim 12, after executing the test command by the test board or the charging device, further comprising:

acquiring by the test board, state information of the charging device;

sending by the test board, the state information of the charging device to the upper computer; and determining by the upper computer, a test result of the test command according to the state information of the charging device.

15. The test method according to claim 12, wherein executing the test command by the charging device comprises:

sending by the test board, the test command to the charging device; and collecting by the test board, output state information of the charging device, wherein the output state information is configured to indicate an output state of the charging device when running according to the test command.

16. The test system according to claim 11, wherein the charging device is an adapter, a power bank, or a car charger.

17. The test board according to claim 1, wherein the command information is configured to indicate a test type, the test type comprising a power consumption test, an over voltage test, an over temperature test and a path impedance test.

18. The test board according to claim 10, wherein the cable is a USB cable or a Type-C cable.

* * * * *